United States Patent
Katoch et al.

(10) Patent No.: US 8,619,462 B2
(45) Date of Patent: *Dec. 31, 2013

(54) VSS-SENSING AMPLIFIER

(75) Inventors: Atul Katoch, Kanata (CA); Cormac Michael O'Connell, Ontario (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/543,495

(22) Filed: Jul. 6, 2012

(65) Prior Publication Data

US 2012/0275242 A1 Nov. 1, 2012

Related U.S. Application Data

(63) Continuation of application No. 12/852,638, filed on Aug. 9, 2010, now Pat. No. 8,238,141.

(51) Int. Cl.
*G11C 11/24* (2006.01)
*G11C 7/00* (2006.01)
*G11C 5/14* (2006.01)

(52) U.S. Cl.
USPC ...... 365/149; 365/189.09; 365/205; 365/207; 365/208; 365/226

(58) Field of Classification Search
USPC ............ 365/149, 189.09, 205, 207, 208, 226
See application file for complete search history.

(56) References Cited

U.S. PATENT DOCUMENTS

| | | | |
|---|---|---|---|
| 5,905,685 A | 5/1999 | Nakamura et al. |
| 6,147,916 A | 11/2000 | Ogura |
| 7,046,565 B1 | 5/2006 | Barth, Jr. et al. |
| 7,349,241 B2 | 3/2008 | Wood |
| 7,355,919 B2 | 4/2008 | Riho et al. |
| 7,372,721 B2 | 5/2008 | Sachdev et al. |
| 7,489,576 B2 | 2/2009 | Hirota et al. |
| 2002/0122344 A1 | 9/2002 | Takemura et al. |

OTHER PUBLICATIONS

European Search Report from corresponding EP Application No. 10187772.8.

*Primary Examiner* — Trong Phan
(74) *Attorney, Agent, or Firm* — Lowe Hauptman & Ham, LLP

(57) ABSTRACT

Some embodiments regard a circuit comprising a memory cell, a first data line, a second data line, a sensing circuit coupled to the first data line and the second data line, a node selectively coupled to at least three voltage sources via at least three respective switches, a fourth switch, and a fifth switch. A first voltage source is configured to supply a retention voltage to the node via a first switch. A second voltage source is configured to supply a ground reference voltage to the node via a second switch, and a third voltage source is configured to supply a reference voltage to the node via a third switch. The fourth switch and fifth switch are configured to receive a respective first control signal and second control signal and to pass a voltage at the node to the respective first data line and second data line.

20 Claims, 4 Drawing Sheets

VSS-SENSING AMPLIFIER

CROSS-REFERENCE TO RELATED APPLICATION

The present application is a continuation of U.S. application Ser. No. 12/852,638, filed on Aug. 9, 2010 which is incorporated herein by reference in its entirety.

FIELD

The present disclosure is related to a VSS-sensing amplifier.

BACKGROUND

VSS-sensing amplifiers refer to amplifiers having the bit lines (e.g., bit lines BL and BLB) charged to the ground reference voltage VSS, instead of the supply operation voltage VDD, before reading or writing. Charging the bit lines is commonly called pre-charging because charging is done before reading or writing. In a conventional VSS sensing amplifier used in embedded Dynamic Random Access Memory (eDRAM), because the bit lines BL and BLB are pre-charged to voltage VSS, when the memory cell stores a high logic data (e.g., a High) the current leaked from the memory cell to a bit line having a low logic level (e.g., a Low) is large.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
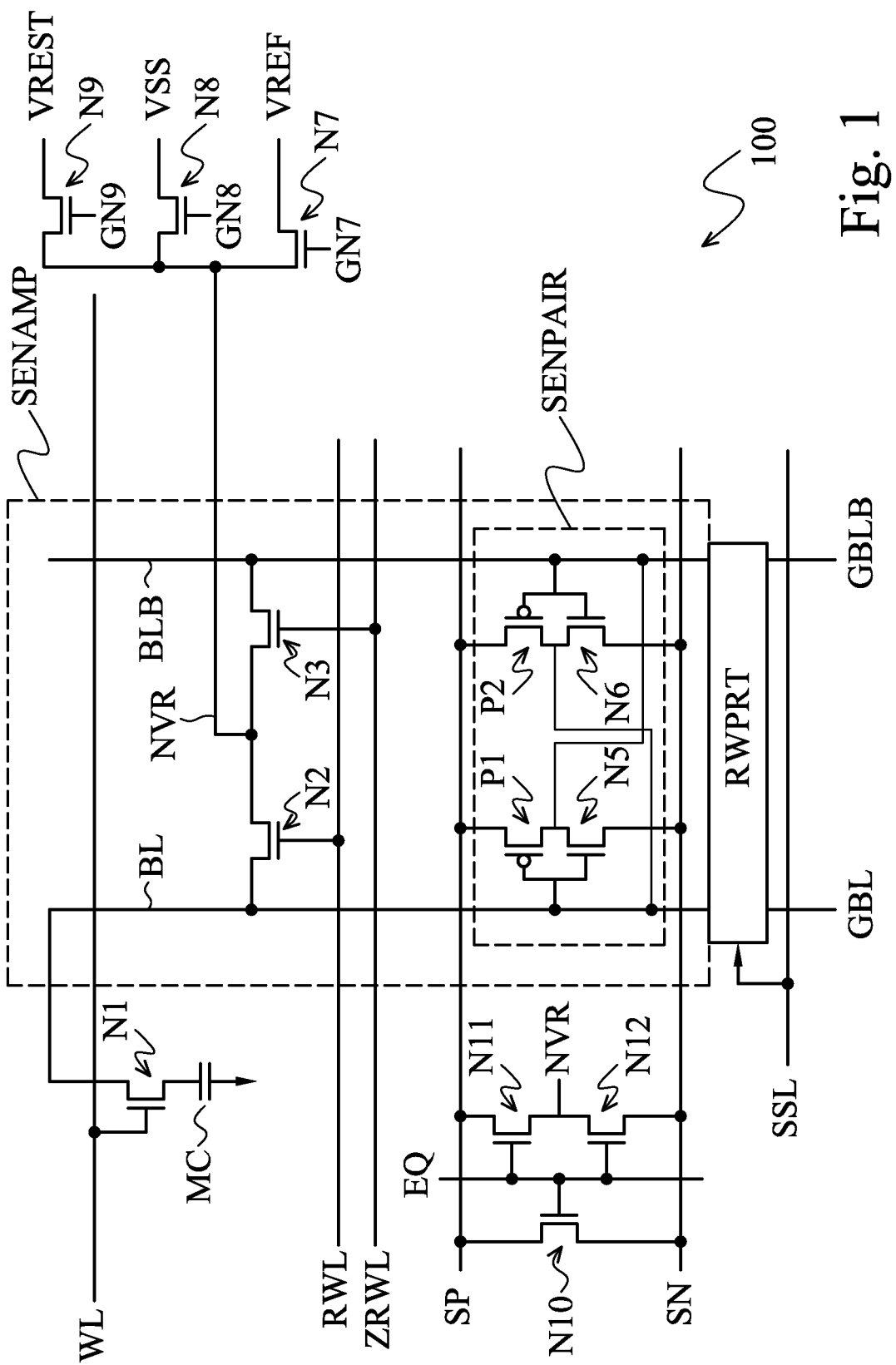
FIG. 1 is a diagram of an exemplary circuit in which a sense amplifier is used with a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments can have one or a combination of the following advantages and/or features. The bit lines are at a specific voltage level (e.g., ½ VDD) when the memory is in a resting mode (e.g., a data retention mode). The retention performance of a sense amplifier used with an eDRAM is improved because the leakage current is reduced as bit lines BL and BLB are raised to about ½ VDD during the retention period. Because the retention period is long (up to milliseconds) compared to the reading or writing access time, which is in the nanosecond range, reducing leakage current significantly reduces power consumption that would otherwise incur due to the leakage current.

Exemplary Circuit

FIG. 1 is a schematic diagram of a circuit 100 illustrating a sense amplifier SENAMP being used with a memory cell MC, in accordance with some embodiments.

Transistors P1, P2, N5 and N6 form the sensing pair SENPAIR for sense amplifier SENAMP. In some embodiments a sensing pair SENPAIR is used for a column of memory cells in a memory array.

Signal RWL controls transistor N2 while signal ZRWL controls transistor N3. Node NVR couples the source/drain regions of transistors N2, N3, N7, N8, N9, N11, and N12, and has a voltage VR (not labeled) supplied by one of the voltages VREF, VSS, or VREST through the respective transistors N7, N8, or N9. For example, when transistor N7 is on, voltage VREF is passed to node NVR, when transistor N8 is on, voltage VSS is passed to node NVR, and when transistor N9 is on, voltage VREST is passed to node NVR, etc. In effect, depending on the situations and the operating condition of the respective transistors N7, N8, or N9, voltage VR has one of a value VREF, VSS, or VREST. In some embodiments, voltage VREF is about 100-200 mV, voltage VDD is about 0.9 V-1.0 V, and voltage VREST is about ½ VDD. In some embodiments, when memory cell MC is in a retention mode (e.g., not in an access mode for reading or writing), transistor N9 is turned on to pass voltage VREST to node NVR, which, in turn, through the respective transistors N2 and N3, is passed to the respective bit line BL and bit line BLB. Because, in some embodiments, voltage VREST is set at ½ VDD, the leakage current, if any, from memory cell MC to any of the bit line BL or BLB is reduced. As a result, some embodiments are advantageous over other approaches in which bit lines BL and BLB are set at ground or voltage VSS that results in a higher leakage current. In some embodiments, the voltage level of voltage VREST, through simulation, is set such that the leakage current is minimum. Some embodiments reveal the minimum leakage current when voltage VREST is in the range of about ⅓ VDD to about ½ VDD. Signals GN7, GN8, and GN9 applied at the gates of the respective transistors N7, N8, and N9 control the respective transistors N7, N8, and N9. In the illustrative embodiments, because transistors N7, N8, and N9 are NMOS, signals GN7, GN8, and GN9 are active High, e.g., they turn on the respective transistors when their voltage levels are High, and turn off the respective transistors when their voltage levels are Low. Transistors N7, N8, and N9 together with the respective voltages VREST, VSS, and VREF are shown outside of sense amplifier SENAMP in accordance with some embodiments, but they can be part of sense amplifier SENAMP in some other embodiments.

Transistor N1 enables access between sense amplifier SENAMP and memory cell MC. Word line WL controls transistor N1 to allow access to memory cell MC. When word line WL is de-activated, e.g., applied with a low logic level (e.g., a Low), it turns off transistor N1 and thus electrically disconnects memory cell MC from the bit line being connected to memory cell MC, which, depending on applications, could be a bit line BL or a bit line BLB. In contrast, when word line WL is activated, e.g., applied with a high logic level (e.g., a High), it turns on transistor N1 and thus electrically connects memory cell MC to a bit line, e.g., a bit line BL or a bit line BLB. FIG. 1 shows bit line BL electrically connected to memory cell MC (via transistor N1) for illustration purposes. Depending on implementations in a memory array, some memory cells are connected to a bit line BL while some other memory cells are connected to a bit line BLB. In some embodiments, memory cell MC is in the access mode (e.g., for reading or writing) when word line WL is High and is in the retention mode when word line WL is Low.

In some embodiments, memory cell MC is a capacitor storing charges, and the Low data stored in memory cell MC indicates a voltage lower than voltage VREF while the High data indicates a voltage higher than voltage VREF. When memory cell MC is connected to a bit line, e.g., bit line BL as shown in FIG. 1, memory cell MC shares the same charge with bit line BL. Depending on the charge representing the logic level of the data stored in memory cell MC, bit line BL is pulled one way or another. For example, if memory cell MC stores a Low, then bit line BL is pulled towards ground or VSS. Conversely, if memory cell MC stores a High, then bit line BL is pulled towards voltage VDD. Once bit line BL shares the charge with memory cell MC, bit line BL and bit line BLB develop a voltage difference between them, which is commonly called a bit line split. The amplitude of the bit line split depends on the charge transfer ratio or the capacitance of memory cell MC and that of bit line BL. If bit line BL is longer and connected to a lot of memory cells, the charge ratio becomes smaller and the bit line split is reduced. Conversely, if bit line BL is shorter and is connected to a less number of memory cells, the charge ratio becomes higher and the bit line split increases. In some embodiments, memory cell MC is a cell of an eDRAM, but the various embodiments are not so limited.

In at least one embodiment, bit lines BL and BLB serve as both an input and output (IO) for memory cell MC. Generally, bit lines BL and BLB are of the opposite level of one another. For example, if bit line BL is Low then bit line BLB is High, and if bit line BL is High then bit line BLB is Low. Further, the bit line on which the data is written or sensed is referenced to the other bit line. For example, applying a High to bit line BL and a Low to bit line BLB, enables memory cell MC to be written with a High. Conversely, applying a Low to bit line BL and a High to bit line BLB, enables memory cell MC to be written with a Low. Further, in a read cycle, sensing (or reading) the logic level at a bit line, e.g., bit line BL, reveals the data stored in memory cell MC. For example, if memory cell stores a High, then sensing a bit line, e.g., bit line BL, reveals a High. Conversely, if memory cell MC stores a Low then sensing a bit line, e.g., bit line, BL, reveals a Low.

Signals SP and SN provide the operational power for sense amplifier SENAMP, e.g., to turn it on or off. Signal SP is the operational power while signal SN serves as a ground reference. In general, when signals SP and SN are at a same level, e.g., pulled to voltage VREF, amplifier SENAMP is off. But when signal SP is High (e.g., at voltage VDD) and signal SN is Low (e.g., at ground), sense amplifier SENAMP is on. For example, in some embodiments, at a pre-charge and equalization stage, sense amplifier SENAMP is off when signals SP and SN are pulled to voltage VREF. When signal SP is raised from voltage VREF to voltage VDD and signal SN is pulled from voltage VREF to voltage VSS, sense amplifier SENAMP receives the desired electrical power and, consequently, is turned on. In some embodiments, during resting time, signals SP and SN are set at voltage VREST.

In some embodiments, signals SP and SN, when appropriate, are pre-charged and equalized by transistors N10, N11, and N12. For example, when signal EQ is activated (e.g., applied with a High), transistors N10, N11, and N12 are turned on, the voltage value VR at node NVR is transferred through the respective transistor N11 and N12 to signals SP and SN, which is then equalized by transistor N10.

Global bit lines GBL and GBLB enable data transferring between a local memory cell, e.g., memory cell MC, and other circuits, e.g., another level of sense amplifiers (not shown). Signal SSL, via the read-write port RWPRT enables such a transfer.

Read-write port RWPRT serves as a mechanism for transferring data between bit lines BL and BLB to other circuitry. For example, in a read access in some embodiments, once the data stored in memory MC is transferred to bit lines BL and BLB, the data is then, through read-write port RWPRT, transferred to a read circuit that provides the actual read data. In contrast, in a write access, the data from the outside circuit, through read-write port RWPRT, is placed on bit lines BL and BLB, and is then transferred to memory cell MC. Read-write port RWPRT can be part of or outside of sense amplifier SENAMP.

In some embodiments, when switching voltage VREF between about 100 mV and a voltage level for a minimum leakage (e.g., ⅓ to ½ VDD) is done efficiently without interfering with the operation of memory cell MC, transistor N9 is not used (e.g., circuit 100 does not include transistor N9 and voltage VREST). In addition, transistor N7 and voltage VREF are used in place of the respective transistor N9 and voltage VREST to provide the appropriate voltage level to node NVR and thus to bit lines BL and BLB. For example, when voltage VREF is clean (e.g., not noisy) to not cause a short circuit to ground and/or changing VREF does not consume larger power, transistor N7 is used in place of transistor N9. For a further example, transistor N7 is turned on, and voltage VREF is raised from about 100 mV to the retention level (e.g., ⅓ to ½ VDD) to be passed to node NVR. When memory cell MC is no longer in the retention mode, voltage VREF is adjusted from the retention level to the appropriate level (e.g., 100-200 mV) as needed.

Exemplary Method

Figure 2:
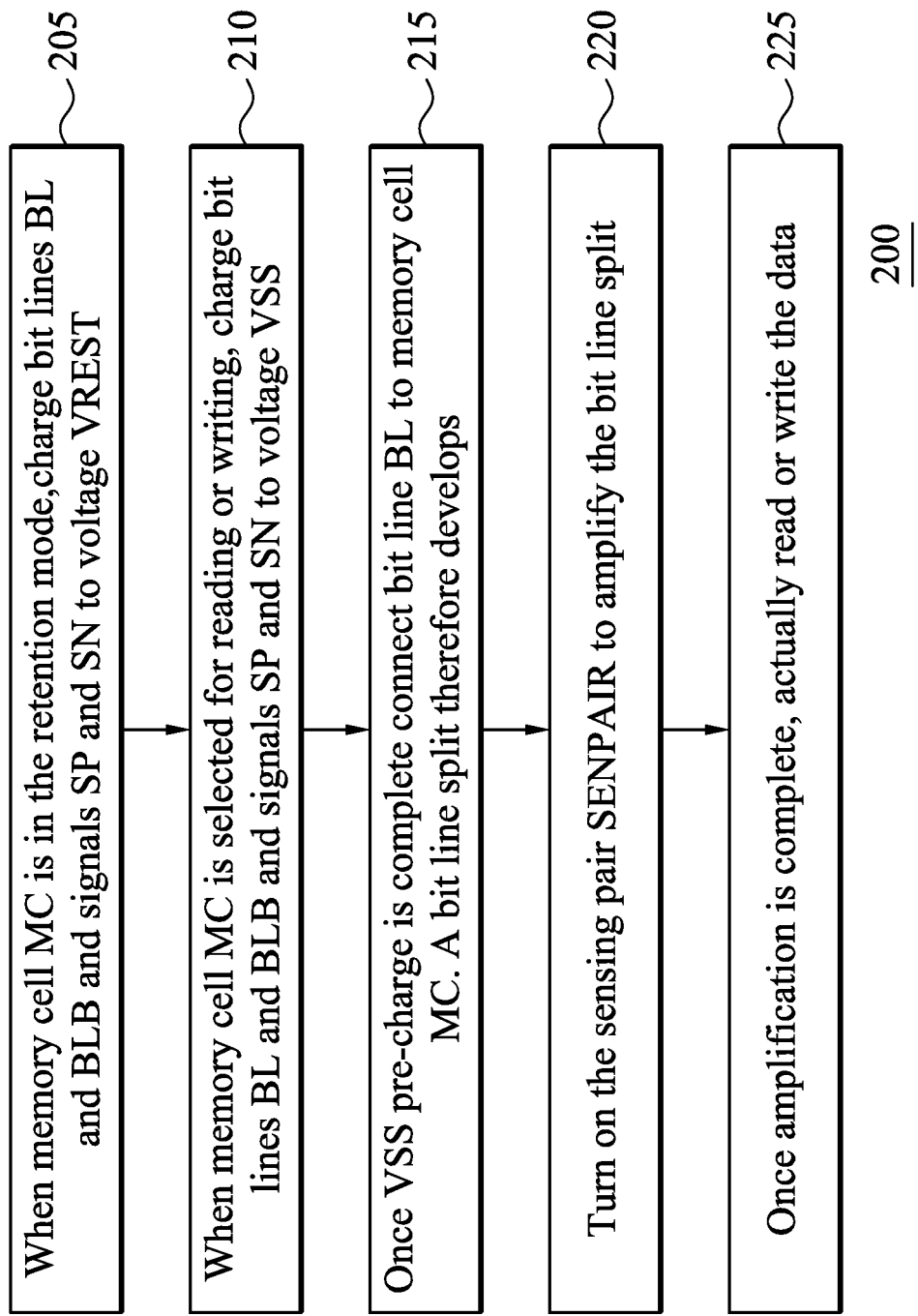
FIG. 2 is a flowchart illustrating a method for operating the circuit in FIG. 1, in accordance with some embodiments.

FIG. 2 is a flowchart 200 illustrating a method for operating circuit 100, in accordance with some embodiments. In this illustration, memory cell MC stores a High.

In step 205, memory cell is in the retention mode. Transistor N9 is turned on to pass voltage VREST to node NVR. At about the same time, transistors N2 and N3 are turned on to pre-charge bit lines BL and BLB to voltage VREST. Similarly, transistors N10, N11, and N12 are turned on to pre-charge and equalize signals SP and SN to voltage VREST. In some embodiments, voltage VREST is set ½ VDD. In some further embodiments, voltage VREST is set such that the leakage current from memory cell MC when memory cell MC stores a High is minimum. Further, the minimum leakage value is obtained by simulation for a particular set of components (e.g., transistors, circuitry) of circuit 100.

In step 210, when the memory cell MC is identified (e.g., selected) for reading or writing, transistor N9 is turned off while transistor N8 is turned on to pass voltage VSS to node NVR. In effect, bit lines BL and BLB, and signals SP and SN are pre-charged to voltage VSS.

Once VSS pre-charge is complete, signal RWL, in step 215, is deactivated to disconnect transistor N2 from bit line BL. At about the same time, word line WL is activated to electrically connect memory cell MC to bit line BL, and transistor N8 is turned off to disconnect node NVR from voltage VSS while transistor N7 is turned on to pass voltage VREF to node NVR. In effect, bit line BL is coupled to memory cell MC while bit line BLB is connected to node NVR having voltage VREF. At this time, signals SP and SN continue to be connected to voltage VSS. Because memory cell MC is connected to bit line BL, memory cell MC and bit line BL share the same charge. As a result, bit line BL is pulled towards a High (e.g., voltage VDD) while bit line BLB remains at voltage VREF, which causes a differential signal (e.g., a bit line split) to develop between bit line BL and bit line BLB.

In step 220, when the bit line split is large enough, signal SP is raised to voltage VDD while signal SN remains at voltage VSS to turn on sensing pair SENPAIR. In some embodiments, the bit line split that is considered large enough is based on one or a combination of a predetermined voltage difference between the two bit lines BL and BLB, a predetermined time elapse (e.g., from the time sensing pair SENPAIR is turned on) or a simulation model.

Because sense amplifier SENAMP is activated, sense amplifier SENAMP amplifies the bit line split, i.e., causes bit lines BL and BLB to change to the respective voltage VDD and voltage VSS, and thus enlarges the bit line split.

In step 225, once amplification is complete, reading or writing is performed accordingly. For example, in a read operation, the data is transferred from bit lines BL and BLB to a read circuit to output the data. In a write operation, however, the data on bit lines GBL and GBLB are forced onto the respective bit lines BL and BLB to be written to memory cell MC.

In the above illustration, in step 205, bit lines BL and BLB are set to voltage VREST (e.g., ½ VDD), which is advantageous because the leakage current from memory cell MC to the bit lines is reduced. For example, if bit line BLB is not raised to voltage VREST but stays at VSS, the voltage difference between voltage VDD and VSS (e.g., 0 V) would cause a larger leakage current.

Illustrative Waveforms

Figure 3:
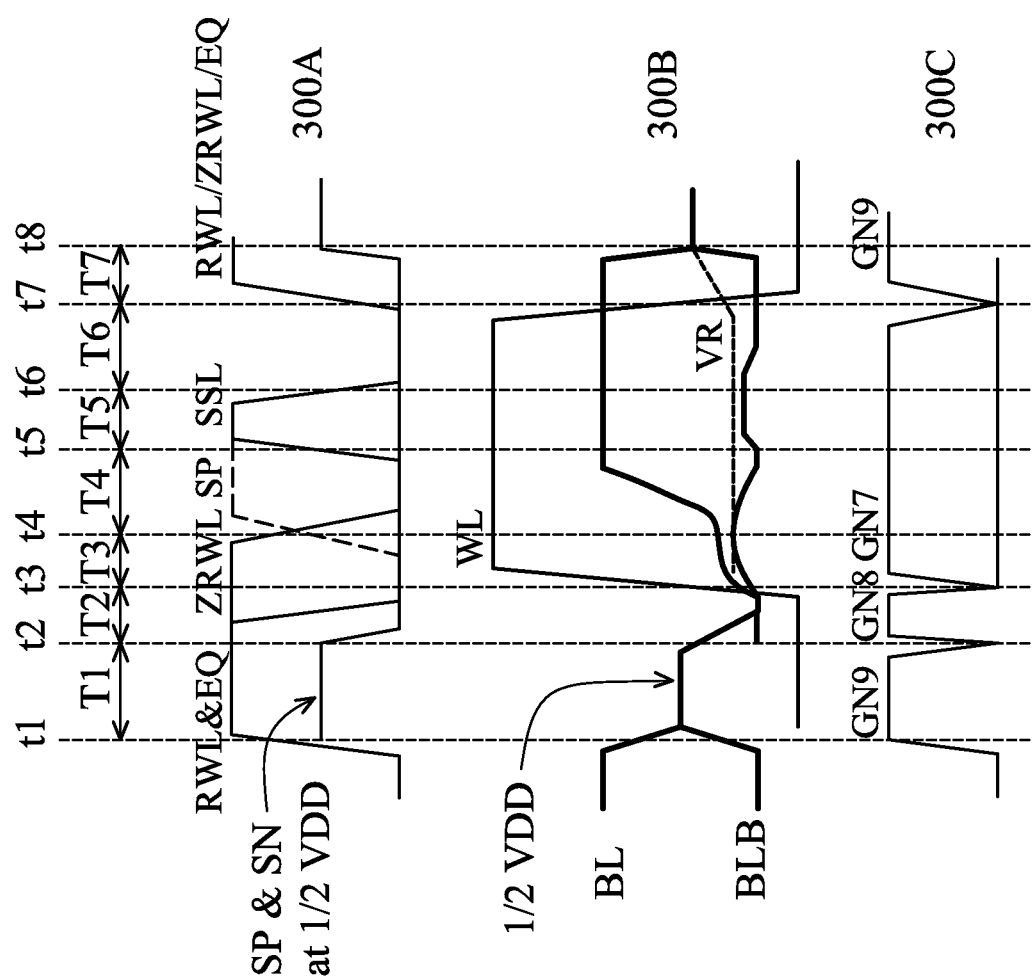
FIG. 3 is a graph of waveforms illustrating the operation of the circuit in FIG. 1, in accordance with some embodiments.

FIG. 3 is a graph of waveforms illustrating an operation of circuit 100, in accordance with some embodiments. In this illustration, memory cell MC stores High data. For simplicity and ease of understanding, waveforms 300A show signals SP, SN, RWL, EQ, ZRWL, and SSL. Waveforms 300B shows signals BL, BLB, VR, and WL, and waveform 300C shows signals GN7, GN8, and GN9.

Prior to time t1, an access has occurred to memory cell MC. The bit line split is at a full swing, e.g., bit line BL is High, while bit line BLB is Low.

At time t1, when the memory access is complete, memory cell M enters into a resting mode for time period T1, both signals RWL and ZRWL are activated to turn on transistors N2 and N3. Signal EQ is activated to turn on transistors N10, N11, and N12. At about the same time, signal GN9 is activated to turn on transistor N9, which transfers voltage VREST to node NVR. In effect, voltage VR, bit lines BL and BLB, and signals SP and SN are pulled to voltage VREST, which, in some embodiments, is set to ½ VDD. Stated another way, bit lines BL and BLB, and signals SP and SN are pre-charged to ½ VDD.

At time t2, memory cell MC is in the access preparation mode for time period T2, signal GN8 is activated to transfer voltage VSS to node NVR. As a result, signal VR is pulled to voltage VSS quickly while bit lines BL and BLB reach voltage VSS a little later. Signal RWL is then deactivated to turn off transistor N2 and disconnect transistor N2 from bit line BL. Alternatively stated, bit line BL is disconnected from node NVR, getting ready to be connected to memory cell MC. Signal EQ is also deactivated to disconnect signals SP and SN from transistors N10, N11, and N12. At that time, signal ZRWL continues to be High to keep bit line BLB at voltage VSS.

At time t3, signal WL is activated (e.g., High) for the time periods T3-T6, placing memory cell MC in the access mode (e.g., for reading or writing). In some embodiments, the logic swing of word line WL is significantly higher then the logic swing of other signals, e.g., signals BL, BLB, SP, SN, RWL, ZRWL, etc. At time t3, signal GN7 is also activated to pass voltage VREF to node NVR. As a result, bit line BLB, then connected to node NVR, is applied with voltage VREF. Because memory cell MC is connected to bit line BL, bit line BL and memory cell MC share the same charge (e.g., High). As a result, the voltage level at bit line BL starts rising towards voltage VDD. Because bit line BLB is connected to node NVR having voltage VREF, bit line BLB starts rising toward voltage VREF.

At time t4, when the bit line split is large enough, signal ZRWL is deactivated to turn off transistor N3, disconnecting bit line BLB from node NVR. At about the same time, signal SP is raised from VSS to voltage VDD and signal SN remains that the VSS level to turn on sensing pair SENPAIR. Because sensing pair SENPAIR is on, bit line BL, which shares the High charge with memory cell MC, is continued to be pulled toward voltage VDD while bit line BLB is pulled towards voltage VSS.

At time t5, the bit line split is fully developed, signal SSL is activated (e.g., driven High) to turn on read-write port RWPRT for an actual read or write action as appropriate. In some embodiments, in a write operation, during period T4, the data on bit lines GBL and GBLB are transferred through read-write port RWPRT to the respective bit lines BL and BLB to be written in period T5. In some embodiments, in a read operation, the data on bit lines BL and BLB are transferred through read-write port RWPRT to another read circuit to output the data.

At time t6, signal SSL is deactivated (e.g., driven Low) to turn off read-write port RWPRT.

At time t7, word line WL is deactivated. Memory cell MC returns to the resting state. At about the same time, signals RWL and ZRWL are activated to turn on the respective transistors N2 and N3. Signal EQ is also activated to turn on transistors N10, N11, and N12. Additionally, signal GN9 is activated while signal GN7 is deactivated to transfer voltage VREST (e.g., ½ VDD) to node NVR. As a result, bit lines BL and BLB, and signals SP and SN are pulled towards voltage VREST, and eventually reach voltage VREST at time t8 when memory cell MC is actually in the resting mode. Those skilled in the art will recognize that time t8 is compatible to time t1 where memory cell MC transitions from an access mode to the resting mode.

In the above illustration, bit lines BL and BLB are charged to voltage VREST when signal WL is deactivated, i.e., when memory cell MC is disconnected from both bit lines BL and BLB.

Exemplary Circuits-Further Embodiments

Figure 4:
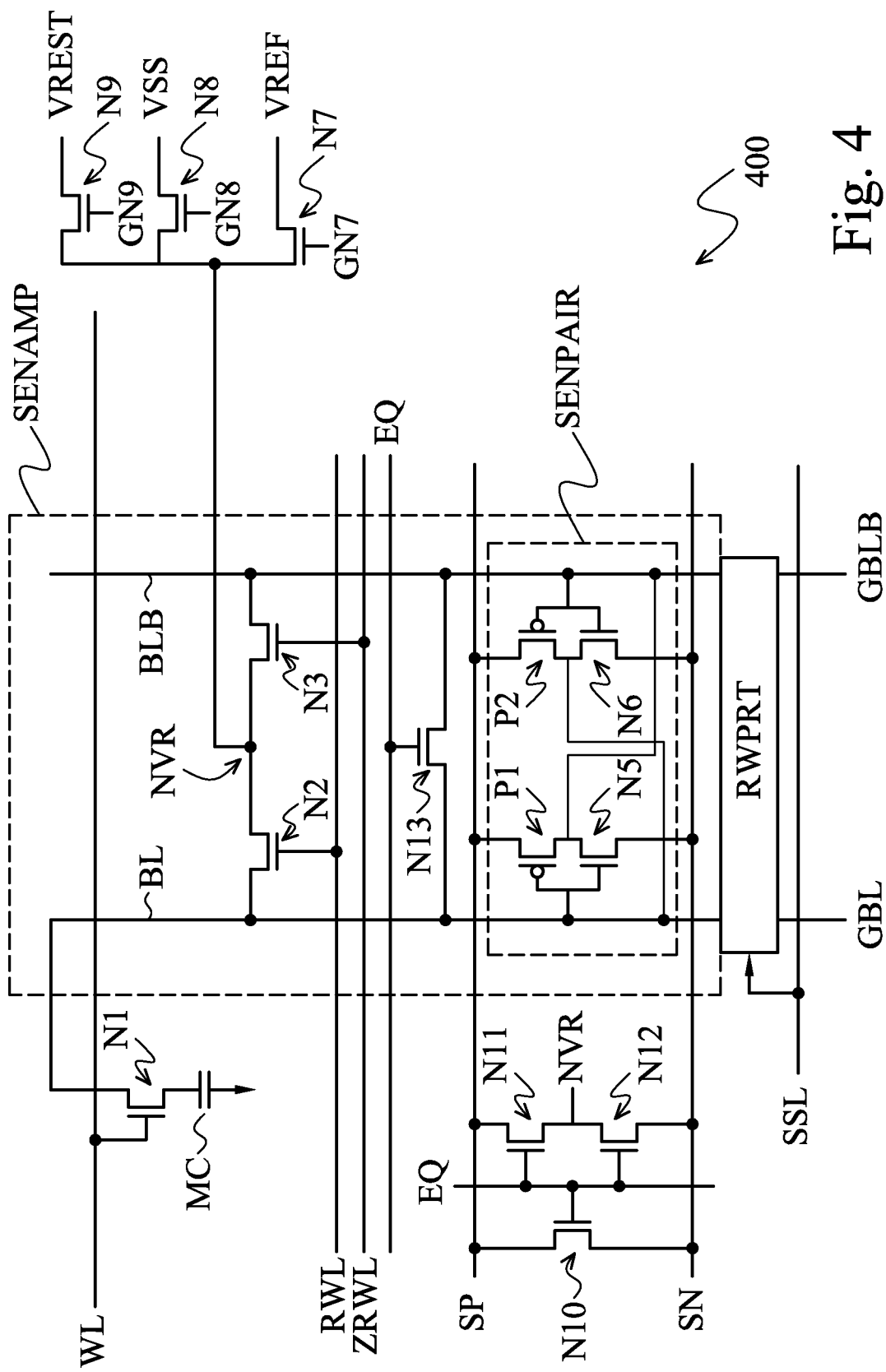
FIG. 4 is a diagram of an exemplary circuit, in accordance with some further embodiments.

FIG. 4 is a diagram of a circuit 400, in accordance with some embodiments. Circuit 400, compared with circuit 100, includes, in addition to all elements of circuit 100, transistor N13 controlled by signal EQ at its gate. In some embodiments, whenever bit lines BL and BLB are charged to voltage VREST (e.g., ½ VDD) in the embodiments of circuit 100, signal EQ, in the embodiments of circuit 400, is activated (e.g., driven High) to turn on transistor N13 to charge and equalize bit lines BL and BLB. For example, when a bit line (e.g., bit line BL) is High (e.g., at voltage VDD), the other bit line (e.g., bit line BLB) is Low (e.g., at voltage VSS), transistor N13, being on, equalizes bit lines BL and BLB to ½ VDD (e.g., ½ (VDD-VSS)). Stated another way, transistor N13 charges and equalizes bit lines BL and BLB to ½ VDD. In those situations, transistor N9 and the voltage source for voltage VREST are not used, or, alternatively, removed from circuit 400 (e.g., circuit 400 does not include transistor N9 or voltage VREST).

In some embodiments, once bit lines BL and BLB are charged and equalized to ½ VDD by transistor N13 and signal EQ, the voltage level at bit lines BL and BLB can then be set (e.g., charged and equalized) to the voltage level at node NVR using transistors N2, N3, and N9 and voltage VREST as explained above. For example, if voltage VDD is 1.0 V, transistor N13 charges and equalizes bit lines BL and BLB to 0.5 V. Bit lines BL and BLB are then set to 0.4 V by having voltage VREST at 0.4 V transferred to node NVR, and then to bit lines BL and BLB through the respective transistors N2 and N3.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of embodiments. The logic level (e.g., Low or High) of the various signals used in the above description is also for illustration purposes, embodiments are not limited to a particular level when a signal is activated and/or deactivated, but, rather, selecting such a level is a matter of design choice. In various situations, a transistor (e.g., each of a transistor N2, N3, N7, N8, N9, etc.) functions as a switch. As a result, a switch can be used in place of a transistor that functions as a switch.

For another example, some embodiments regard a circuit comprising a first data line, a second data line, a sensing circuit coupled to the first data line and the second data line, a node configured to be selectively coupled to at least three voltage sources including at least a first voltage source, a second voltage source, and a third voltage, a first switch, and a second switch. The first voltage source is configured to supply a retention voltage to the node. The second voltage source is configured to supply a ground reference voltage to the node. The third voltage source is configured to supply a reference voltage to the node. The first switch and second switch are configured to receive respective first control signal and second control signal and to pass a voltage at the node to the respective first data line and second data line. In some embodiments, when the memory cell is in a retention mode the first voltage source is configured to supply a voltage value to the node such that a current leak from the memory cell to the first data line or the second data line is reduced compared to the node receiving a voltage VSS value.

For another example, some embodiments regard a circuit comprising a memory cell, a first data line, a second data line, a node, a sensing circuit, a first switching device, a second switching device. The first data line is electrically coupled to the memory cell. The node is configured to selectively provide a node voltage to the first data line and the second data line. The sensing circuit is coupled to the first data line and the second data line. The first switching device has a first node, a second node, and a third node. The second switching device has a fourth node, a fifth node, and a sixth node. The first node is coupled to the first data line. The second node is configured to receive a first control signal. The third node is coupled to the fourth node and forms a reference node. The fifth node is configured to receive a second control signal. The sixth node is coupled to the second data line. In some embodiments, the circuit further comprises a third switching device coupled to the first data line and the second data line. Further, the circuit is configured to receive a third control signal, and, when the memory cell is in a retention mode, the circuit is configured to supply a retention voltage value to the first data line and the second data line.

For another example, some embodiments regard a method of operating a VSS-sensing amplifier, the method comprising applying a retention voltage value to a first bit line, a second bit line, a first supply voltage line, and a second supply voltage line; identifying a memory cell for accessing; applying a voltage VSS value to the first bit line, the second bit line, the first supply voltage line, and the second supply voltage line; electrically connecting the first bit line to the memory cell, and applying a reference voltage value to the second bit line, thereby causing a voltage split between the first bit line and the second bit line to develop; and disconnecting the second bit line from the reference voltage, and applying an operational voltage value to the first supply voltage line, thereby causing the voltage split to further develop.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
   a first data line;
   a second data line;
   a sensing circuit coupled to the first data line and the second data line;
   a reference voltage generation circuit configured to output one of a retention voltage, a ground reference voltage, and a reference voltage as a data line reference voltage, a voltage level of the retention voltage being greater than that of the ground reference voltage, and a voltage level of the reference voltage being greater than that of the ground reference voltage;
   a first switch configured to couple the data line reference voltage to the first data line in response to a first control signal; and
   a second switch configured to couple the data line reference voltage to the second data line in response to a second control signal.

2. The circuit of claim 1, further comprising:
   a memory cell coupled to the first data line.

3. The circuit of claim 1, wherein the reference voltage generation circuit comprises:
   an output node;
   a third switch configured to couple the reference voltage to the output node in response to a third control signal;
   a fourth switch configured to couple the ground reference voltage to the output node in response to a fourth control signal; and
   a fifth switch configured to couple the retention voltage to the output node in response to a fifth control signal.

4. The circuit of claim 1, wherein the sensing circuit comprises:
   a first power line;
   a second power line;
   a sensing circuit coupled between the first power line and the second power line; and
   a switching circuit coupled between the first power line and the second power line and configured to couple the data line reference voltage to the first power line and the second power line in response to a sixth control signal.

5. The circuit of claim 4, further comprising a sixth switch coupled between the first data line and the second data line and configured to couple the first data line to the second data line in response to the sixth control signal.

6. The circuit of claim 4, further comprising a seventh switch coupled between the first power line and the second power line and configured to couple the first power line to the second power line in response to the sixth control signal.

7. The circuit of claim 1, wherein the voltage level of the retention voltage being greater than the voltage level of the reference voltage.

8. The circuit of claim 1, wherein the voltage level of the retention voltage ranges from $1/3$ to $1/2$ of an operational voltage of the circuit.

9. A circuit comprising:
a first data line;
a second data line;
a sensing circuit coupled to the first data line and the second data line;
a reference node;
a first switch having a first node, a second node, and a third node, the first node coupled to the first data line, the second node configured to receive a first control signal, and the third node coupled to the reference node;
a second switch having a fourth node, a fifth node, and a sixth node, the fourth node coupled to the reference node, the fifth node configured to receive a second control signal, and the sixth node coupled to the second data line;
a third switch coupled between the first data line and the second data line and configured to couple the first data line to the second data line in response to a third control signal; and
a reference voltage generation circuit configured to output a data line reference voltage to the reference node.

10. The circuit of claim 9, further comprising:
a memory cell coupled to the first data line.

11. The circuit of claim 9, wherein the reference voltage generation circuit is configured to output one of a retention voltage, a ground reference voltage, and a reference voltage as the data line reference voltage.

12. The circuit of claim 11, wherein a voltage level of the retention voltage is greater than that of the ground reference voltage, and a voltage level of the reference voltage is greater than that of the ground reference voltage.

13. The circuit of claim 12, wherein the voltage level of the retention voltage is greater than the voltage level of the reference voltage.

14. The circuit of claim 12, wherein the voltage level of the retention voltage ranges from $1/3$ to $1/2$ of an operational voltage of the circuit.

15. The circuit of claim 9, wherein the reference voltage generation circuit comprises:
an output node;
a fourth switch configured to couple a reference voltage to the output node in response to a fourth control signal;
a fifth switch configured to couple a ground reference voltage to the output node in response to a fifth control signal; and
a sixth switch configured to couple a retention voltage to the output node in response to a sixth control signal.

16. A method, performed according to an order as numbered, comprising:
(1) applying a retention voltage to a first data line and a second data line;
(2) applying a ground reference voltage to the first data line and the second data line;
(3) coupling the first data line to a memory cell and applying a reference voltage value to the second data line;
(4) disconnecting the second data line from the reference voltage; and
(5) enabling a sensing circuit coupled to the first data line and the second data line.

17. The method of claim 16, wherein the enabling the sensing circuit comprising:
applying an operation voltage to a first power line of the sensing circuit; and
applying the ground reference voltage to a second power line of the sensing circuit.

18. The method of claim 16, further comprising:
(6) disabling the sensing circuit; and
(7) applying the retention voltage to the first data line and the second data line.

19. The method of claim 16, wherein a voltage level of the retention voltage is greater than a voltage level of the reference voltage.

20. The method of claim 16, wherein a voltage level of the retention voltage ranges from $1/3$ to $1/2$ of an operational voltage of the sensing circuit.

\* \* \* \* \*